(12) United States Patent
Baechtold et al.

(10) Patent No.: US 7,173,547 B2
(45) Date of Patent: Feb. 6, 2007

(54) OFFSET COMPENSATION IN LOCAL-PROBE DATA STORAGE DEVICES

(75) Inventors: Peter Baechtold, Gattikon (CH); Giovanni Cherubini, Rueschlikon (CH); Evangelos S. Eleftherious, Zurich (CH); Theodor W. Loeliger, Thalwil (CH)

(73) Assignee: International Business Machines Incorporated, Armonk, NY (US)

( * ) Notice: Subject to any disclaimer, the term of this patent is extended or adjusted under 35 U.S.C. 154(b) by 137 days.

(21) Appl. No.: 11/083,405

(22) Filed: Mar. 18, 2005

(65) Prior Publication Data

US 2005/0207234 A1   Sep. 22, 2005

(30) Foreign Application Priority Data

Mar. 22, 2004   (EP)   ............................ 04405173

(51) Int. Cl.
*H03M 1/12*   (2006.01)
(52) U.S. Cl. .................. 341/118; 365/189.08; 365/206
(58) Field of Classification Search ............. 341/118, 341/120; 365/185.08, 185.05, 206, 211
See application file for complete search history.

(56) References Cited

U.S. PATENT DOCUMENTS 5,583,706 A * 12/1996 Dudley et al. ............... 360/46
6,005,431 A * 12/1999 Mehr et al. .................. 327/307
2005/0066107 A1* 3/2005 Bachtold et al. ............. 711/1
2005/0162932 A1* 7/2005 Ricotti et al. ............ 365/189.05
2005/0259366 A1* 11/2005 Champion et al. ........ 360/324.2

FOREIGN PATENT DOCUMENTS

WO   WO 03021592 A2 *   3/2003

* cited by examiner

Primary Examiner—Howard L. Williams
(74) Attorney, Agent, or Firm—Louis P. Herzberg

(57) ABSTRACT

Methods and apparatus for compensating offsets in a read signal generated by a sensor associated with a probe of a local-probe data storage device during read-scanning by the probe of bit-positions on a storage surface. An apparatus comprises a generator for generating an offset compensation signal, and a subtraction stage for producing an output signal dependent on the difference between the offset compensation signal and the sensor read signal at each bit-position. In some embodiments, an offset signal generator generates an offset compensation signal dependent upon a predetermined measurement of the sensor read signal. In another aspect the offset signal generator low-pass filters the sensor read signal during read scanning to generate the offset compensation signal. Particular embodiments also include a secondary offset compensation stage for applying additional offset compensation techniques to the output signal from the subtraction stage.

30 Claims, 12 Drawing Sheets

OFFSET COMPENSATION IN LOCAL-PROBE DATA STORAGE DEVICES

FIELD OF THE INVENTION

This invention relates generally to local-probe data storage devices, and more particularly to the compensation of offsets in read signals generated during reading of data in such devices.

BACKGROUND OF THE INVENTION

In local-probe data storage devices, stored data is represented on a storage surface by the presence and absence of indentations, or "pits", which are formed in the storage surface by a probe of the device. One example of such a device, based on the AFM (Atomic Force Microscope), is detailed in IBM Journal of Research & Development, Volume 44, No. 3, May 2000, pp 323–340, "The 'Millipede'- More Than One Thousand Tips for Future AFM Data Storage", Vettiger et al., and the references cited therein. This device employs an integrated array of individually-addressable probes, where each probe here is a nanometer-sharp tip mounted on the end of a microfabricated cantilever. The array of probes can be moved over the surface of a storage medium in the form of a polymer substrate, such that each probe can read and write data within its own storage field on the surface. In particular, a resistive heater element is formed in the cantilever body to enable heating of the probe tip to a write temperature on application of a drive signal in the write-scan mode. This causes local heating of the polymer surface at the point of contact with the tip, allowing the tip to penetrate the surface to create a pit. Such a pit typically represents a bit of value "1", a bit of value "0" being represented by the absence of a pit at a bit-position on the storage surface. In a read-scan mode, the thermomechanical probe mechanism can be used to read data by sensing the deflection of the cantilever as the tip is moved over the pattern of pits and "no pits" at bit-positions on the storage surface. In this particular device, the heater also acts as a read sensor by virtue of its temperature-dependent resistance. During read-scanning, a drive signal is applied to heat the heater to a lower temperature than in the write mode so that the tip does not get hot enough to deform the storage surface. However, as the tip scans the storage surface, heat transfer between the heater and storage surface is more efficient when the tip enters a pit than when there is no pit at a bit-position. The temperature, and hence resistance, of the heater will therefore be less when reading a "1" than a "0". A read signal dependent on the resistance of the heater during read scanning can thus be processed by detection circuitry to detect the data at the scanned bit-positions.

One of the most critical issues for read detection in local-probe storage devices is the high resolution required to extract the signal containing the information on whether a read bit is a "1" or a "0". In the device described above, for example, reading a "1" typically produces a relative change in the sensor resistance of the order of $\Delta R/R = 10^{-4}$. The useful information signal can thus be viewed as a small signal superimposed on a very large offset signal. The presence of various other offsets, such as those resulting from manufacturing tolerances, makes the task of read detection even more difficult. For example, the use of simple threshold detection is not feasible in the presence of such offset signals due to the high precision required for analog-to-digital conversion.

Our international patent application published under WO 03/021592 A2 discloses read detection apparatus for local-probe storage devices where the detection apparatus incorporates an offset compensation mechanism. In the system described, a dedicated reference cantilever probe is provided in the array. During read-scanning, the reference probe reads a dedicated reference area of the storage surface in which all bits are equal to "0". The sensor read signal from the reference probe serves as a reference signal. This reference signal is subtracted from the read signal obtained from each probe reading a data field in operation, thereby reducing the dynamic range of the read signal. The resulting difference signal is low-pass filtered to limit the bandwidth of high-frequency noise, and a high-pass filter then eliminates residual offsets and low-frequency noise. The high-pass filter samples the difference signal at a rate of 1/T, and subtracts each sample from the succeeding sample to generate a ternary difference signal. The delay factor T here corresponds to the read interval, i.e. the time between reading of successive bits on the storage surface. The ternary difference signal is supplied to an analog-to-digital converter in the form of a three-level decision element which determines whether the read bit is a "0" or a "1".

However, note that the signal generated by the reference probe is a noisy signal. During the read process, a cantilever in the foregoing system can be modelled as a variable resistance at a temperature of about 350° C., so that thermal noise (Johnson's noise) must be taken into account, as well as electronics noise and media noise that will be present in the reference signal. The level of these disturbances is similar to the level of the noise in the desired read signal, and hence use of a reference probe for offset compensation leads to a loss of about 3 dB in signal-to-noise ratio. Secondly, in an array of probes the read signal samples are typically obtained by applying a drive pulse to the probes in a column (or a row) of the array, low-pass filtering the individual read signals, and finally sampling the filter output signals. This process is repeated sequentially until all columns (or rows) of the array have been addressed. The array is then moved to the next bit-position and the read process restarted from the first column (or row). The time between two drive pulses corresponds to the time it takes for a probe to move from one bit-position to the next. As constant velocity is usually assumed, the pulses are periodically applied to each probe. If only one probe is employed as a reference probe, the rate of pulses applied to the reference probe will be different from the rate of pulses applied toga data probe. If the pulse rate is high in particular, the period between pulses applied to the reference probe may be of the order of the probe thermal time constant. As a consequence, the response of the reference probe will not match the responses of the data probes, and the accuracy of offset compensation will be degraded. To alleviate this problem, a reference probe per column (or row) might be used, each reading a corresponding reference field. However, this approach increases the implementation complexity and reduces efficiency of the system.

SUMMARY OF THE INVENTION

In accordance with the aforementioned need, one aspect of the present invention provides apparatus for compensating offsets in a read signal generated by a sensor associated with a probe of a local-probe data storage device during read-scanning by the probe of bit-positions on a storage surface. An apparatus comprises: an offset signal generator for generating an offset compensation signal in dependence on a predetermined measurement of the sensor read signal; and a subtraction stage for producing a preliminary output signal dependent on the difference between the offset compensation signal and the sensor read signal at each bit-position.

A second aspect of the present invention also provides apparatus for compensating offsets in a read signal generated by a sensor associated with a probe of a local-probe data storage device during read-scanning by the probe of bit-positions on a storage surface. This apparatus comprises: an offset signal generator for receiving the sensor read signal during read scanning and low-pass filtering the read signal over a plurality of read intervals, where a read interval corresponds to the time between reading of successive bits from the storage surface, to generate an offset compensation signal; and a subtraction stage for producing an output signal dependent on the difference between the offset compensation signal and the sensor read signal at each bit-position. In embodiments of this aspect of the invention, therefore, the offset compensation signal is continually updated during read-scanning by low-pass filtering the sensor read signal over a plurality of read intervals. This provides a particularly simple and convenient mechanism for following variations in a time-varying offset, avoiding sharp changes in the offset compensation signal.

The invention also provides local-probe data storage devices including apparatus as hereinbefore described. In particular, a further aspect of the invention provides a local-probe data storage device.

BRIEF DESCRIPTION OF THE DRAWINGS

These, and further, aspects, advantages, and features of the invention will be more apparent from the following detailed description of a preferred embodiment and the appended drawings, wherein.

DETAILED DESCRIPTION OF THE INVENTION

Figure 1:
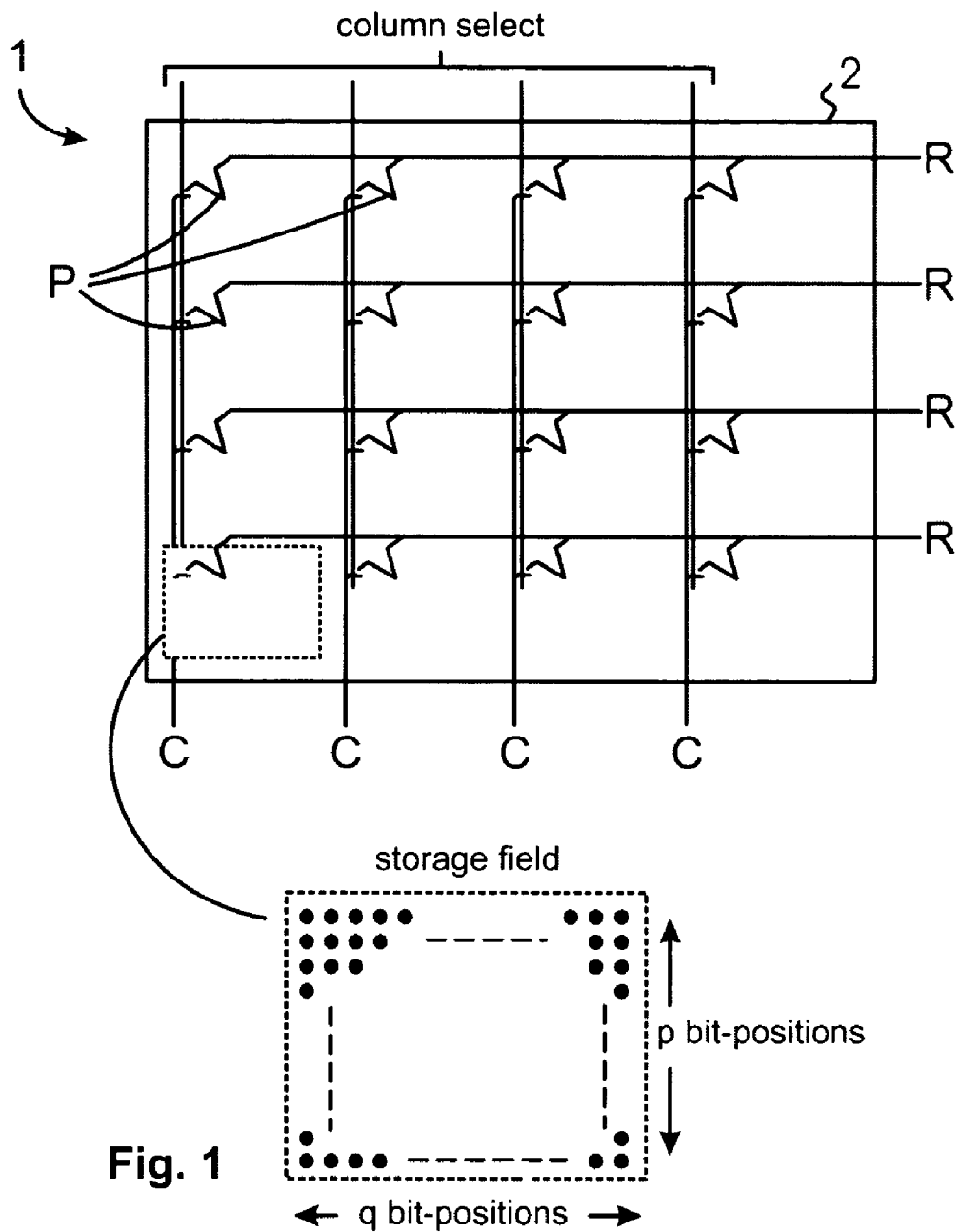
FIG. 1 is a simplified schematic of a local-probe data storage device in which embodiments of the invention may be applied.

The present invention provides methods, apparatus and systems for compensating offsets in a read signal generated by a sensor associated with a probe of a local-probe data storage device during read-scanning by the probe of bit-positions on a storage surface. An apparatus comprises: an offset signal generator for generating an offset compensation signal in dependence on a predetermined measurement of the sensor read signal; and a subtraction stage for producing a preliminary output signal dependent on the difference between the offset compensation signal and the sensor read signal at each bit-position.

In embodiments of this aspect of the invention, the signal for compensating offsets in a sensor read signal is dependent on a predetermined measurement of the read signal from that sensor. A preliminary output signal is then derived based on the difference between this offset compensation signal and the sensor read signal during subsequent read-scanning of bit-positions on the storage surface. This enables read detection to be performed in the presence of offsets without the need to process read signals that exhibit a large dynamic range. Moreover, offset compensation is performed without requiring dedicated reference probes and reference fields, thus obviating the drawbacks discussed above. By applying embodiments of the invention in a system where Johnson's noise and media noise are the dominating influences, signal-to-noise ratio can be improved by approximately 3 dB compared to prior systems using reference probes.

The predetermined measurement on which the offset compensation signal is dependent may be, for example, a single measurement or an average measurement of the read signal from the sensor in question. In addition, the offset compensation signal may be dependent on a predetermined measurement of the read signal from that sensor alone, or may be additionally dependent on the read signal from other sensors. In particular, where the storage device comprises an array of probes with associated sensors, the offset signal generator may be adapted for generating an offset compensation signal corresponding to an average sensor read signal in dependence on a predetermined measurement of sensor read signals from a plurality of the sensors in the array.

In some embodiments, the predetermined measurement on which the offset compensation signal is based may be a one-off measurement in advance of operation of the device. In other embodiments, the measurement may be repeated at appropriate intervals and the resulting offset compensation signal applied until the next measurement is taken. This offers a degree of adaptivity in operation, whereby the offset compensation signal can be adapted to measurement variations. In particular, the offset compensation apparatus may be selectively operable in an acquisition mode and a tracking mode, and the offset signal generator may be adapted for acquiring said predetermined measurement in the acquisition mode, and for generating an offset compensation signal dependent on that measurement in the subsequent tracking mode. The acquisition mode may be selected periodically in operation, preferably automatically. Hence the apparatus may include a mode controller for periodically selecting the acquisition mode in operation. The probe, or array where provided, may be set in a reference position for the acquisition mode, conveniently at a position reading the storage surface prior to the start of a line of bit-positions in the data storage field(s). Thus, the mode controller may be adapted for selecting the acquisition mode prior to commencement of read-scanning of successive lines of bit-positions on the storage surface.

The offset signal generator can be implemented in various ways in embodiments of the invention, for example by an analog or digital filter, and particular examples for preferred embodiments will be detailed below. Moreover, the offset compensation performed in generation of the preliminary output signal may be just the first stage in a more sophisticated offset compensation scheme. In particular, preferred embodiments of the apparatus include a secondary offset compensation stage for applying additional offset compensation techniques to the preliminary output signal. Such embodiments offer enhanced offset compensation with improved adaptivity in operation, and various examples will be described in detail below.

The present invention also provides apparatus for compensating offsets in a read signal generated by a sensor associated with a probe of a local-probe data storage device during read-scanning by the probe of bit-positions on a storage surface. However, this apparatus comprises: an offset signal generator for receiving the sensor read signal during read scanning and low-pass filtering the read signal over a plurality of read intervals, where a read interval corresponds to the time between reading of successive bits from the storage surface, to generate an offset compensation signal; and a subtraction stage for producing an output signal dependent on the difference between the offset compensation signal and the sensor read signal at each bit-position. In embodiments of this aspect of the invention, therefore, the offset compensation signal is continually updated during read-scanning by low-pass filtering the sensor read signal over a plurality of read intervals. This provides a particularly simple and convenient mechanism for following variations in a time-varying offset, avoiding sharp changes in the offset compensation signal.

The invention also provides local-probe data storage devices including apparatus as hereinbefore described. In particular, a further aspect of the invention provides a local-probe data storage device comprising: a storage surface for storing data represented by the presence and absence of pits at bit-positions on the surface; at least one probe for read-scanning of bit-positions on the storage surface, the probe having an associated sensor for generating a read signal indicative of data read from said bit-positions during read-scanning; and offset compensation apparatus as hereinbefore described for compensating offsets in the read signal generated by the sensor associated with the or each probe.

In general, where features are described herein with reference to an apparatus embodying the invention, corresponding features may be provided in a method embodying the invention, and vice versa. Hence, another aspect of the invention provides a method for compensating offsets in a read signal generated by a sensor associated with a probe of a local-probe data storage device during read-scanning by the probe of bit-positions on a storage surface, the method comprising: generating an offset compensation signal in dependence on a predetermined measurement of the sensor read signal; and producing a preliminary output signal dependent on the difference between the offset compensation signal and the sensor read signal at each bit-position.

The invention further provides a method for compensating offsets in a read signal generated by a sensor associated with a probe of a local-probe data storage device during read-scanning by the probe of bit-positions on a storage surface. A method comprising: supplying the sensor read signal to an offset signal generator during read scanning; at the offset signal generator, low-pass filtering the read signal over a plurality of read intervals, where a read interval corresponds to the time between reading of successive bits from the storage surface, to generate an offset compensation signal; and producing an output signal dependent on the difference between the offset compensation signal and the sensor read signal at each bit-position.

FIG. 1 shows a simplified representation of one example of a local-probe storage device in which offset compensation apparatus embodying the invention may be utilized. The storage device 1 is a device of the type as referenced earlier, having a 4×4 array of cantilever probes P for reading and writing of data on a storage surface 2. The probe array can be moved relative to storage surface 2 such that each probe P can read and write data within its own storage field of the surface. In particular, as the probe array is moved relative to the storage surface, each probe P can be moved through a series of p lines of q bit-positions as represented schematically in the enlarged section of the figure. In each storage field, data can be written by writing bits at successive bit-positions along a line, and can similarly be read back as the probe is advanced through the appropriate series of bit-positions.

In this example, a parallel addressing scheme is employed whereby probes can be addressed a column at a time for the read/write operation at a given array position. Probes in the same row are connected to a common row-address line R, and probes in the same column are connected to a common column-address line C. As illustrated in the figure, each probe P is connected between its row- and column-address lines via a switch, and activation of switches for the same column of probes is via a common column-select line. The column-select lines, the row-address lines R and the column-address lines C are connected to drive/detector circuitry (not shown) of the device for controlling read/write operations via the various control lines. For the read operation at a given array position, a read drive signal is applied to the column-address lines C, and the switches for the first column of probes are closed via a control signal on the first column-select line. The read signal from each probe in the first column is then obtained on its respective row line R, and can be processed by apparatus to be described below to detect the data bit read by the probe. The next column of probes is then activated via the next column-select line, and the data bits are read out from this column. This continues until all columns have been addressed, whereupon the probe array is advanced to the next bit-position and the operation is repeated.

Figure 2:
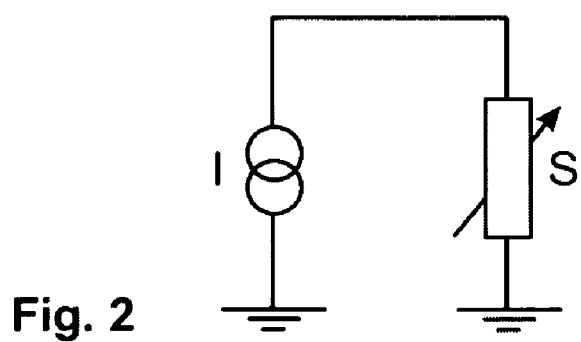
FIG. 2 illustrates an equivalent circuit for a sensor of the FIG. 1 device.

As described earlier, the read signal containing the information on whether a read bit is a "0" or a "1" is generated by a sensor associated with each probe, in this case a thermomechanical sensor provided by the heater in the cantilever body of the probe. The resistance of this sensor varies with temperature as the probe tip moves in and out of pits on the storage surface, and thus differs when the probe is reading a "1" and a "0". During the read operation, the sensor circuit is electrically equivalent, to a first degree of approximation, to a current or voltage source in cascade with a variable resistor. This is illustrated in FIG. 2 for a sensor S and current source I. At each bit-position during a read operation, the read signal dependent on resistance of sensor S is thus processed as described below to detect the bit value read from that bit-position.

Figure 3:
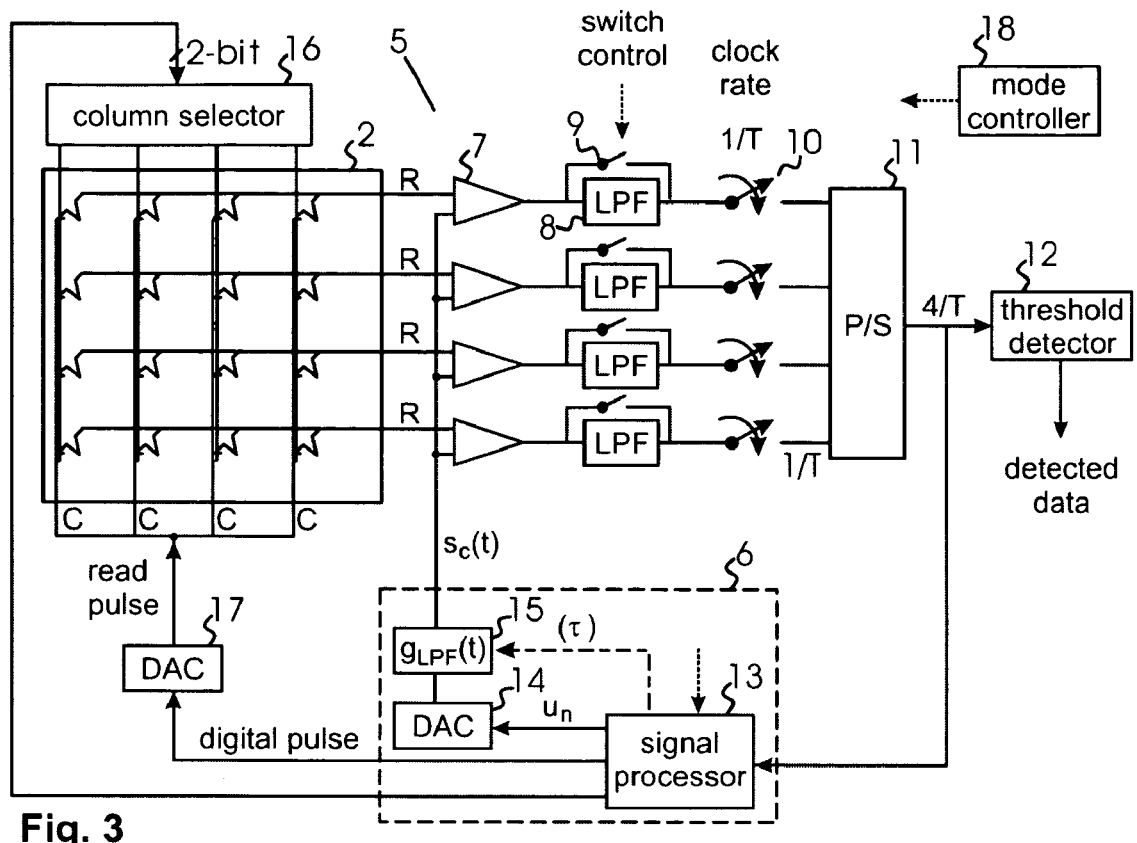
FIG. 3 shows a first embodiment of offset compensation apparatus according to the invention.

FIG. 3 is a schematic block diagram of a storage device as described above employing a first example of offset compensation apparatus embodying the invention. The offset compensation apparatus, indicated generally at 5, is connected to the row lines R of the array for the read operation. The apparatus 5 includes an offset signal generator, indicated generally at 6, for generating an offset compensation signal $s_c(t)$ as described below. For each row line R, the apparatus 5 includes a subtraction stage in the form of a differential amplifier 7 having one input connected to the corresponding row line and another connected to the offset signal generator 6 for receiving the offset compensation signal $s_c(t)$. The output of each differential amplifier is connected via a low-pass filter (LPF) 8, having a bypass switch 9, to a sampler represented by a switch 10. Samplers 10 sample the signals on their respective read-channels with a clock rate of 1/T, where T corresponds to the read interval, i.e. the time between reading of successive bits on that channel. (Note however that during the acquisition mode described below the samplers may operate at a rate higher than 1/T). The outputs of samplers 10 in the four read-channels are connected to a parallel-to-serial converter (P/S) which supplies an output to a detection stage implemented here by threshold detector 12. This output is also connected to offset signal generator 6 for a purpose described below.

The offset signal generator 6 of this embodiment comprises a digital signal generator implemented by signal processor 13, a digital-to-analog converter (DAC) 14, and a low-pass smoothing filter 15. The signal processor 13 also performs basic read-drive functions in this example, in particular providing a 2-bit control signal to a column selector 16 for controlling column selection as described above, and supplying a read drive signal to the probe array. A pulse drive signal is employed in this embodiment, a digital pulse supplied by signal processor 13 being converted by a DAC 17 to an analog read pulse which is supplied to the column-address lines of the probe array as described above.

The signal $s_c(t)$ produced by offset signal generator 6 in this embodiment is an approximation of the average sensor read signal based on a predetermined measurement of the sensor read signals from all probes in the array. Measurement of the sensor read signals is performed in an acquisition mode of the apparatus. More particularly, the apparatus 5 is selectively operable in an acquisition mode and a tracking mode under control of mode controller 18. The acquisition mode is selected periodically in this example, with the probe array positioned such that each probe reads an area of the storage surface prior to the start of a line of bit-positions in its storage field. Control signals from mode controller 18 signal the acquisition mode to signal processor 13 and cause bypass switches 9 in the probe read-channels to close. The offset compensation signal $s_c(t)$ is suppressed in this mode, so that when read pulses are applied, column by column, to the probe array, the resulting sensor read signals for each column are output via differential amplifiers 7. The read signals are sampled by samplers 10, converted to serial form by P/S converter 11, and supplied column by column to signal processor 13. The read signal samples for the array are then averaged by signal processor 13 to obtain an average read signal s(t) with duration $T_s$ for the array. Based on this measurement, signal processor 13 sets parameters to be used for generating the offset compensation signal $s_c(t)$ in the subsequent tracking mode as follows.

Figure 4A:
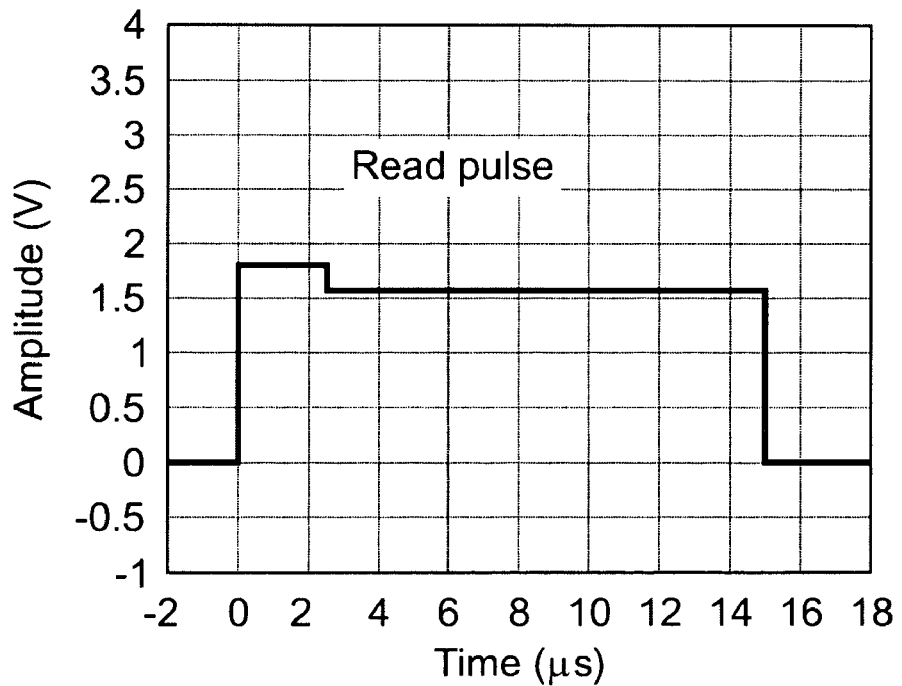
FIGS. 4a and 4b are plots of various signals in operation of the first embodiment.
Figure 4B:
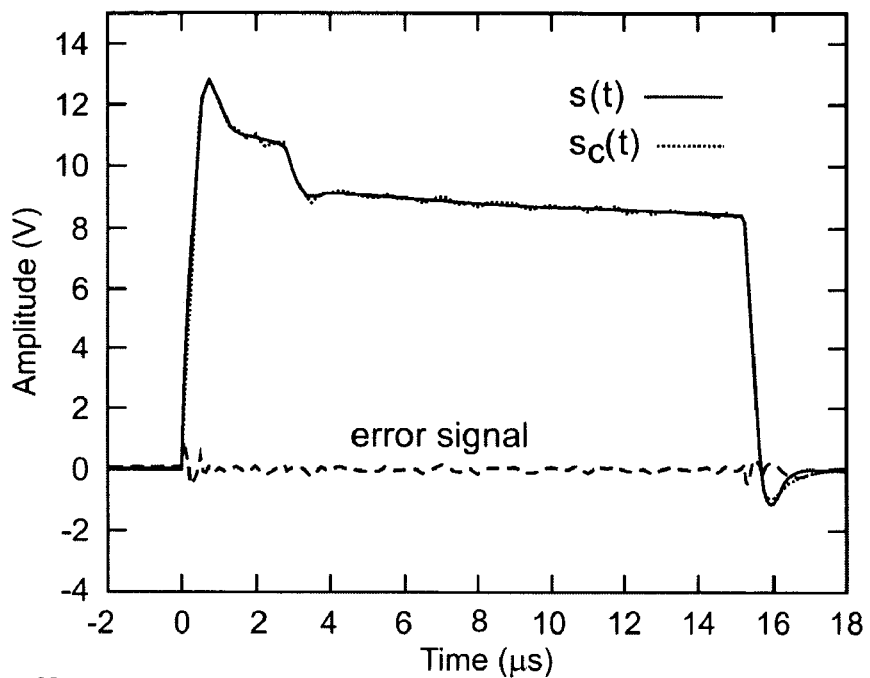

The signal $s_c(t)$ approximating the average read signal is obtained by applying a digital signal $u_n$, having non-zero samples for n=0, ..., N−1, to DAC 14, where N determines the granularity of the pulse shaping and may be set as desired for a given system. The impulse response of DAC 14 is given by $$p(t) = rect\left(\frac{t - T_{DAC}/2}{T}\right),$$

where $T_{DAC}$ denotes the duration of the rectangular pulse of the DAC. The resulting analog signal is then applied to low-pass smoothing filter 15 whose impulse response is given by $g_{LPF}(t) = e^{-t/\tau} U(t)$, where $\tau$ is the time constant of the filter and U(t) denotes the unit step function. For a given duration of the DAC impulse response $T_{DAC}$ and length of the digital signal N, such that $NT_{DAC} \geq T_s$, the optimum values of the samples $u_n$, n=0, ..., N−1, and of the filter time constant r are determined by signal processor 13 by minimizing the error $$\varepsilon^2 = \int_0^{T_s} \left[ s(t) - \sum_{n=0}^{N-1} u_n (p * g_{LPF})(t - nT_{DAC}) \right]^2 dt,$$

where * denotes convolution. An example of the read pulse is illustrated in FIG. 4a, and FIG. 4b shows the average read signal s(t), the offset compensation signal $s_c(t)$, and the error signal obtained for an 8-bit DAC with T=0.25 μs and N=64, yielding a signal-to-error ratio SER=37 dB.

Once the appropriate parameters for generation of the signal $s_c(t)$ have been set by signal processor 13 in the acquisition mode, the signal $s_c(t)$ is applied as the offset compensation signal for the read operation in the subsequent tracking mode. In this mode, bypass switches 9 in the read channels are open, and the offset compensation signal is supplied to one input of each differential amplifier 7 as indicated in the figure. For each column of probes addressed in the read operation, the read signal on each channel is supplied to differential amplifier 7 which subtracts the offset compensation signal $s_c(t)$. The output of the differential amplifier, which comprises the useful information signal, is then low-pass filtered by filter 8 to remove high-frequency noise, and sampled by sampler 10. The resulting signals from the four read channels are converted to serial form by P/S converter 11, and the serial signal is supplied to threshold detector 12 which determines the values of the four data bits read by the column of probes.

Selection of the acquisition mode may be performed prior to read-scanning of each line of bit-positions in the storage fields, though in general the acquisition mode may be selected as often as desired for a given device. As an alternative example, the acquisition operations may be performed at the beginning of a read operation by sampling the individual probe read signals at equally spaced instants. However, while such adaptive systems—which allow updating of the offset compensation signal $s_c(t)$—are generally preferred, in other embodiments a one-off measurement may be made to determine the signal $s_c(t)$, e.g. off-line prior to first operation by recording the probe read signals with an oscilloscope.

The above approach may also be adapted to allow computation of offset compensation signals for respective subsets of probes in the array, or even for each individual probe, by effectively providing an offset signal generator for each subset/probe. This offers potential for improving the SER for each probe read signal, though application of the offset compensation method in the digital domain as here requires the noise generated by the DACs to be small compared to the thermal noise generated by the probes.

Figure 5:
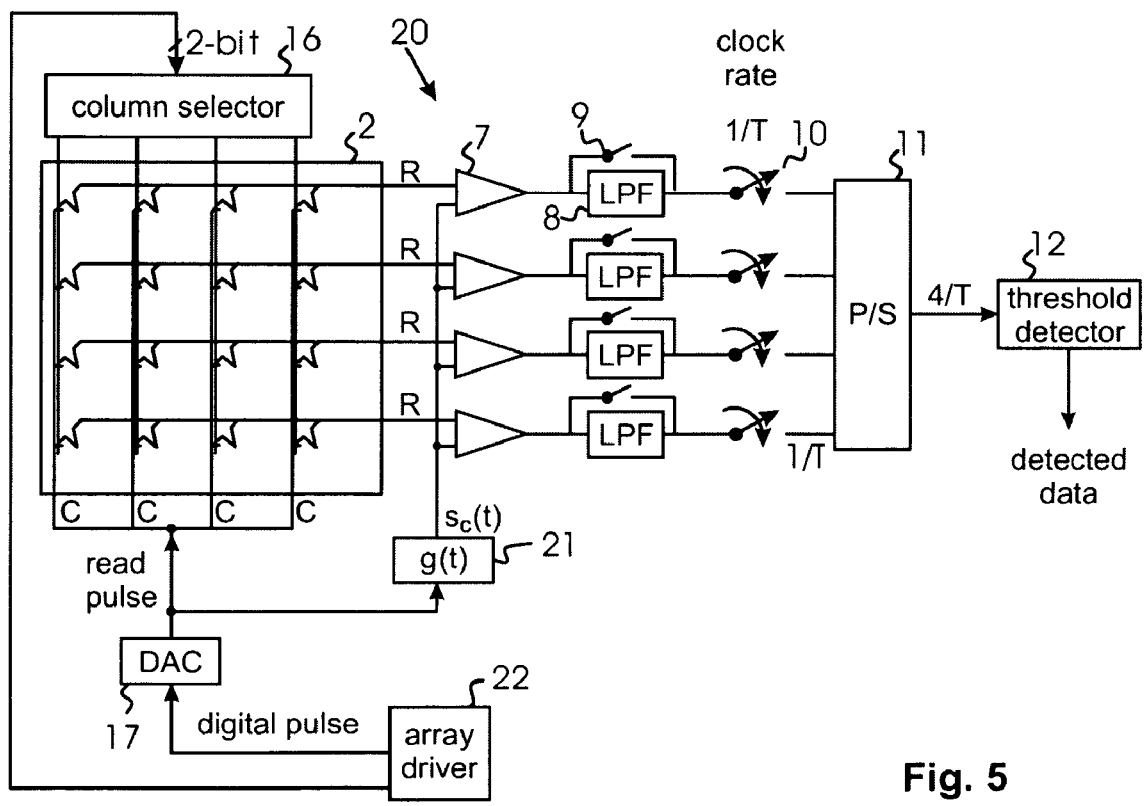
FIG. 5 shows a second embodiment of offset compensation apparatus according to the invention.

An alternative to the above embodiment is illustrated in the schematic block diagram of FIG. 5 where the offset compensation system is implemented in the analog domain. The apparatus 20 of this embodiment includes various components corresponding to those of FIG. 3. Like parts are thus labeled by like references in these figures, and only the key differences will be described for this embodiment. The offset signal generator of apparatus 20 is provided by an analog filter 21 which is connected to receive the same read pulse that is supplied to the probe array. The read pulses here are supplied by array drive circuitry 22 which also controls the column selector 16. The impulse response g(t) of the analog filter 21 is preset in this example based on a predetermined, one-off measurement of the read signals from the probe array. Specifically, the read signals from all probes in the array are measured and averaged to obtain an average read signal s(t). Based on this measurement, an appropriate impulse response for filter 21 is determined as follows.

Figure 6:
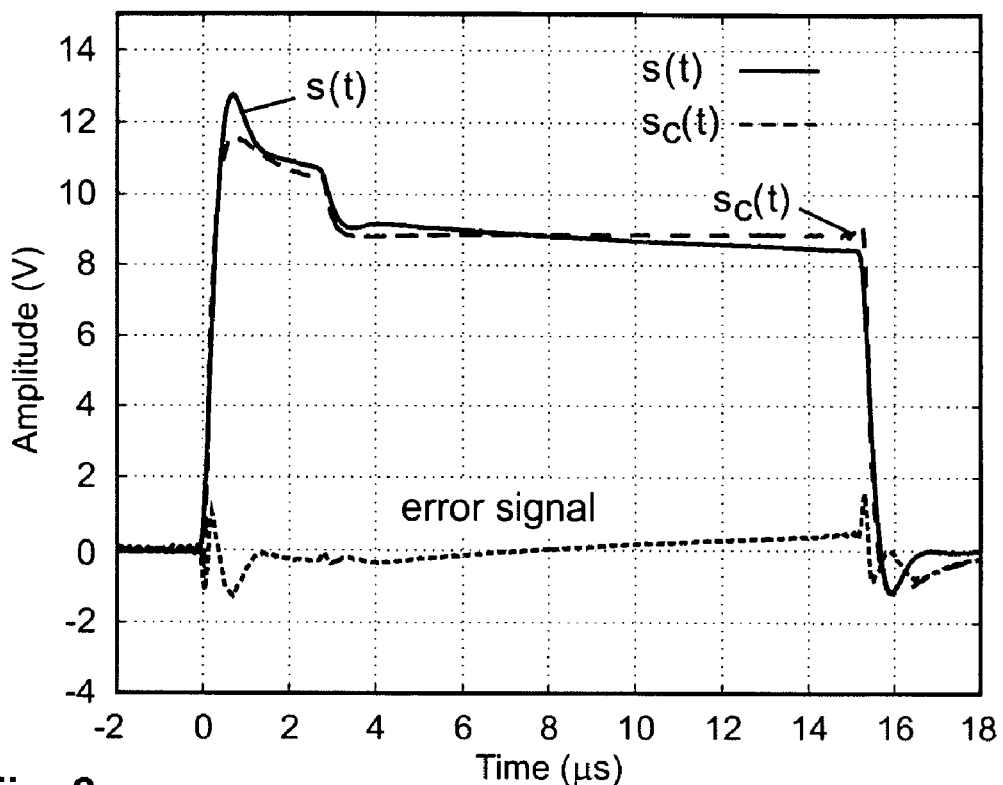
FIG. 6 is a plot, equivalent to FIG. 4b, for the second embodiment.
Figure 7:
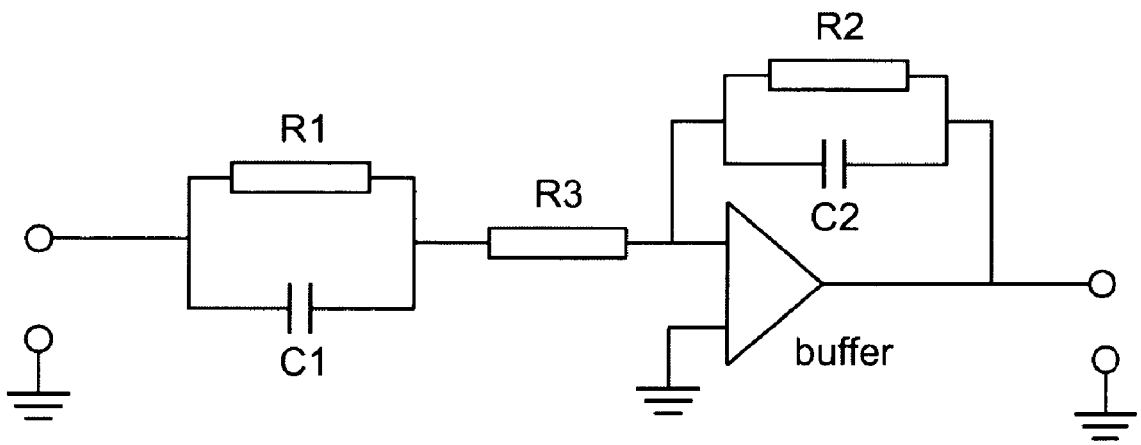
FIG. 7 shows an implementation of an analog filter in the second embodiment.

The response of an analog filter is conveniently expressed in the frequency domain in terms of poles and zeros. For a given number of poles $N_p$ and zeros $N_z$, the optimum location of the poles $p_0, \ldots, p_{N_p-1}$, and of the zeros $z_0, \ldots, z_{N_z-1}$, is obtained by minimizing the error $$\varepsilon^2 = \int \left| S(f) - S_p(f) \frac{\prod_{n=0}^{N_z-1}(2\pi i f - z_n)}{\prod_{n=0}^{N_p-1}(2\pi i f - p_n)} \right|^2 df,$$

where S(f) and $S_p$(f) denote the Fourier transforms of the average read signal s(t) and of the read pulse respectively. By selecting the analog filter 21 accordingly, the output of filter 21 in operation will be an offset compensation signal $s_c$(t) approximating the average read signal s(t). Operation of this embodiment during a read operation is then equivalent to that of FIG. 3. Assuming the read pulse is as shown in FIG. 4a, FIG. 6 shows the average read signal s(t), the offset compensation signal $s_c$(t), and the error signal obtained for a simple analog filter with one zero and two poles, yielding SER=30 dB. FIG. 7 illustrates an exemplary realization of the analog filter 21 using discrete components comprising resistors R1 to R3, a buffer and capacitors C1 and C2.

While the FIG. 5 embodiment uses a fixed analog filter 21 based on off-line computation of the system parameters, other embodiments using adaptive analog filters may perform real-time computation of the average read signal and optimum filter parameters in an acquisition mode selected at intervals in operation. In this case, as in FIG. 3, bypass switches 9 will be provided in the read channels, together with a mode controller 18 and a signal processor for receiving the read signals in the acquisition mode, performing the necessary calculations and setting the parameters of filter 21 accordingly.

As for the approach in the digital domain, it is possible to extend the system of FIG. 5 so that offset compensation for each individual probe, or a subset of the probes, is performed by a distinct analog filter whose parameters are optimized using the response of that probe or subset. Note also that only one DAC is sufficient for implementing the approach in the analog domain, whereas two DACs are needed for the digital domain. Moreover, the noise requirements on a single DAC used as a source for both the read pulse and the offset compensation signal are less stringent than in the case where a separate DAC is needed to generate the offset compensation signal. In fact, any noise component present in the read pulse will be significantly suppressed if the amplifier stage, which performs the subtraction of the offset compensation signal from the read signal, has good common mode rejection ratio characteristics.

The offset compensation scheme implemented by the above embodiments is applicable to both current and voltage driven read sensors. In both embodiments, the problem of read-detection in the presence of offsets is solved without the need to process read signals that exhibit a large dynamic range. The reduction of the dynamic range of the read signal is achieved by subtracting an offset compensation signal which approximates the average sensor response. The need for dedicated reference sensors and reference fields is completely avoided. Moreover, for a system where Johnson's noise and media noise are the dominating disturbances, signal-to-noise ratio can be improved by approximately 3 dB.

Further embodiments of the invention will now be described which are particularly effective in covering the wide range of variations of electrical parameters exhibited by currently-manufactured probe arrays. For example, variations of individual cantilever-probe resistance in the range of ±20% may need to be accommodated. The adaptive offset compensation techniques described in the following enable the range of probe parameters for which proper device operation is obtained to be significantly extended compared to non-adaptive techniques.

Figure 8:
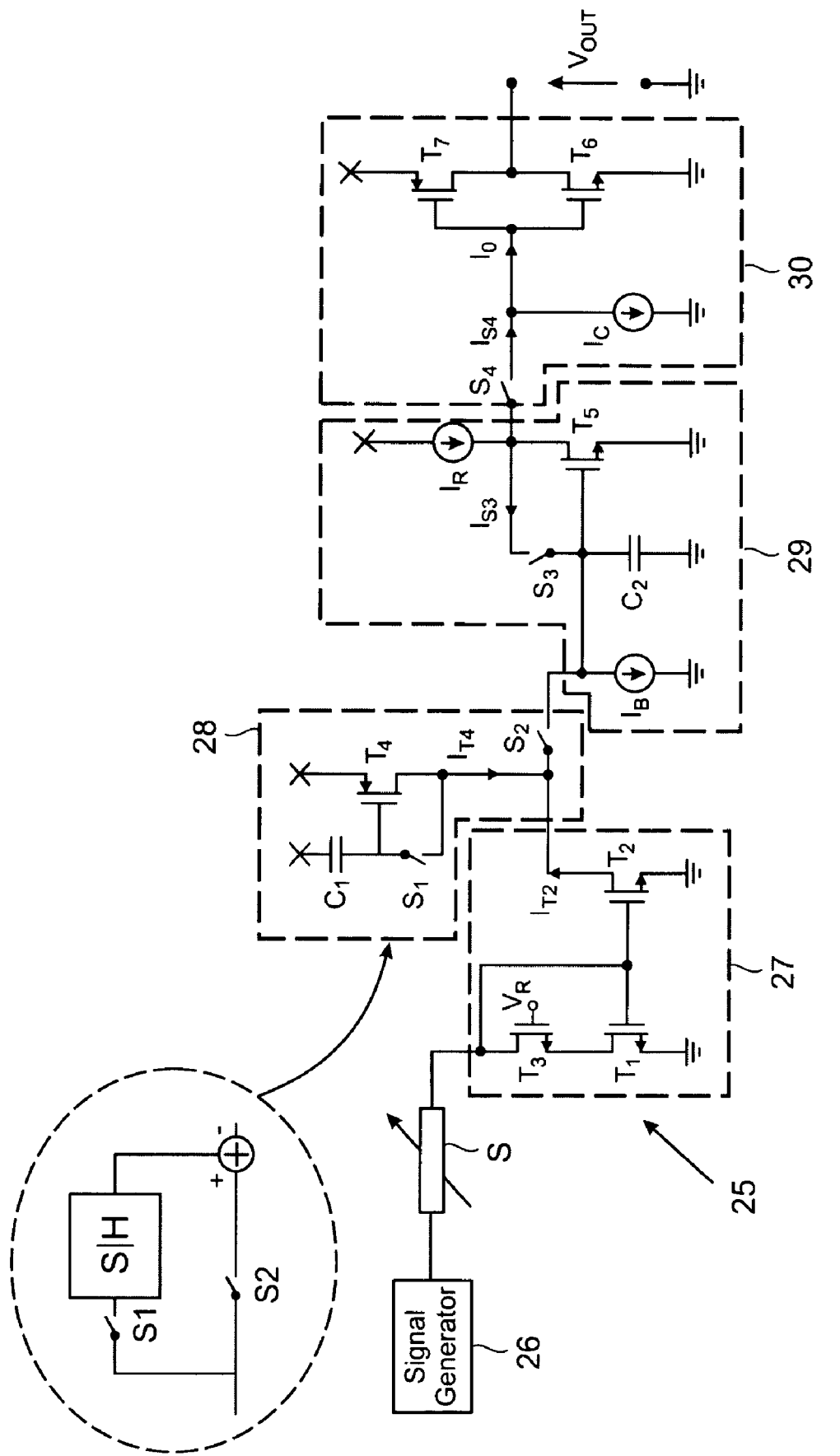
FIG. 8 shows a third embodiment of offset compensation apparatus according to the invention.

A third example of offset compensation apparatus embodying the invention is illustrated in FIG. 8. The offset compensation apparatus, indicated generally at 25, is illustrated schematically for a single-probe read channel in which a dc drive signal is applied to read sensor S at each bit-position of the probe by a signal generator 26. (While operation will be described for the single-probe read channel in the following, the system may of course be employed for an array of probes in a storage device generally as described above by appropriate replication of circuitry as will be apparent to those skilled in the art). The apparatus 25 includes a current mirror, indicated generally at 27 and formed by transistors $T_1$ to $T_3$. This is connected to a switched current memory stage 28, formed by transistor $T_4$, capacitor $C_1$ and switches $S_1$ and $S_2$, which implements an offset signal generator and subtraction stage for this embodiment as described below. This is followed by an integration stage 29, formed by transistor $T_5$, capacitor $C_2$, and reference current source $I_R$ with switch $S_3$ and bias current source $I_B$. A subsequent detection stage 30 is formed by transistors $T_6$ and $T_7$, with bias current source $I_C$ and switch $S_4$.

Figure 9B:
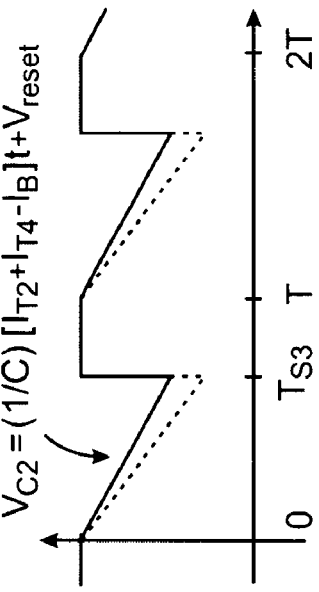
FIGS. 9a to 9f illustrate the form of various signals in operation of the third embodiment.
Figure 9D:
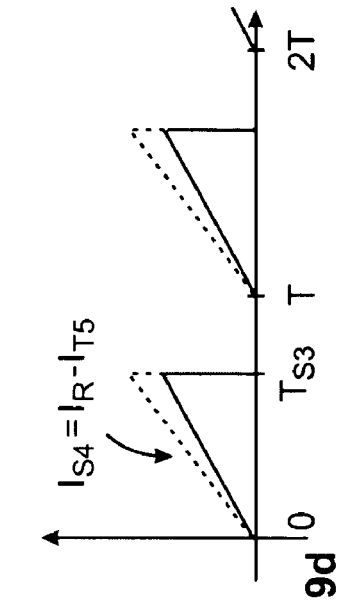
Figure 9F:
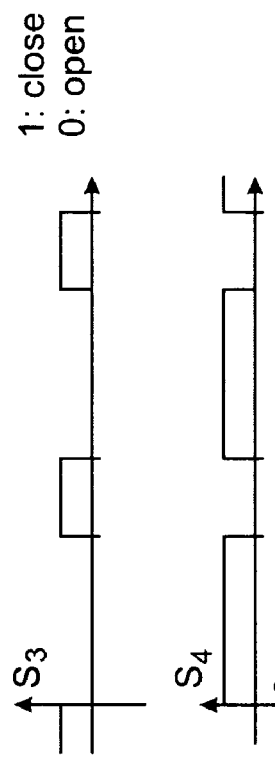
Figure 9A:
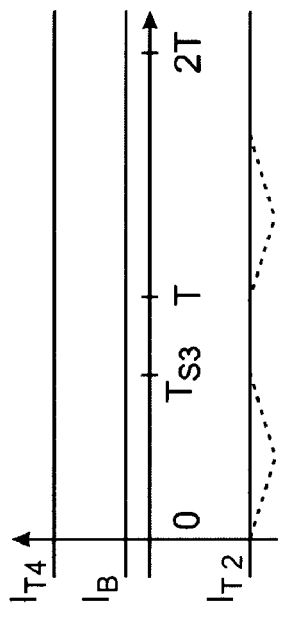
Figure 9C:
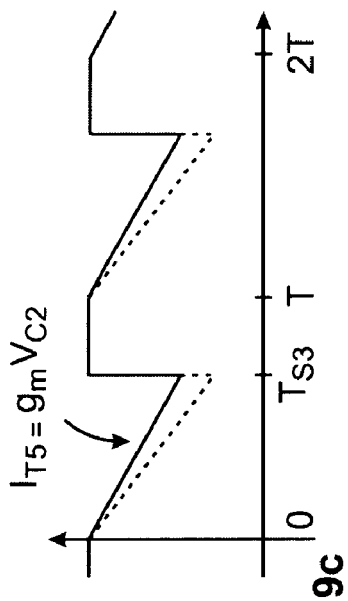
Figure 9E:
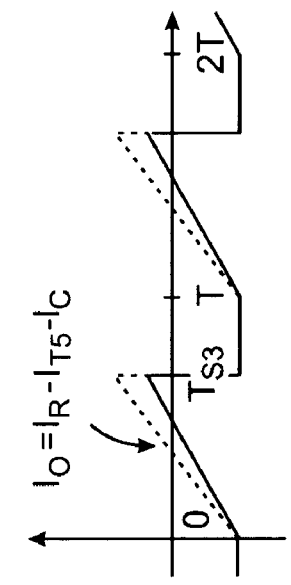

The apparatus 25 of this embodiment is operable in an acquisition mode and a tracking mode to implement an adaptive offset compensation scheme. In this example, the acquisition mode is selected under control of a mode controller (not shown) prior to read-scanning of each line of bit-positions in the probe storage field, with the probe reading a position prior to the start of the data line. In the acquisition mode, the offset signal generator implemented by switched current memory stage 28 measures the read signal from sensor S, and an offset compensation signal based on this measurement is then applied by the offset signal generator during reading of bit positions in the subsequent tracking mode. Specifically, for operation in the acquisition mode switch $S_1$ is closed and switch $S_2$ is opened. The current $I_{T2}$ at the output of current mirror 27 mirrors the current through sensor S. Since switch $S_1$ is closed, capacitor $C_1$ charges until the gate voltage of transistor $T_4$ produces a reference current $I_{T4}$ through $T_4$ which matches the current through the sensor. During read-scanning of bit-positions in the subsequent tracking mode, switch $S_1$ is open and switch $S_2$ is closed. Assuming the voltage across capacitor $C_1$ does not vary with time, the reference current $I_{T4}$ will flow through $T_4$, but the current through sensor S, and hence current $I_{T2}$, will vary depending on whether a bit of value "0" or "1" is being read at the current bit-position. This is illustrated schematically in FIG. 9a, where the dotted line shows the variation of $I_{T2}$ when a "1" is read, T represents the read interval, and $T_{S3}$ (see FIG. 9f below) represents the point of closing switch $S_3$ and opening switch $S_4$ to reset the voltage across capacitor $C_2$ after reading the bit-value at the current bit-position. It can be seen that switched current memory stage 28 is effectively equivalent to the circuit shown in the inset in FIG. 8, comprising a sample-and-hold circuit (S/H) for sampling the sensor current in the acquisition mode, and an adder serving as a subtraction stage for subtracting the reference current from the sensor current in the tracking mode. The reference current $I_{T4}$ is therefore applied as an offset compensation signal in the tracking mode, so that, assuming the sensor characteristics do not vary during the tracking mode, only the incremental current that carries the useful information about the data being read is supplied to the subsequent circuitry. FIGS. 9b to 9f illustrate various signals in operation of this circuitry, with the dotted lines showing the variation for reading a bit of value "1". FIG. 9f shows that switch $S_3$ is open and switch $S_4$ is closed during a detection period of each read interval, and then at time $T_{S3}$ switch $S_3$ is closed and switch $S_4$ is opened for a reset period. The state of these switches may be controlled by the mode controller in operation. FIG. 9b shows the voltage $V_{C2}$ across capacitor $C_2$; FIG. 9c shows the current $I_{T5}$ through transistor $T_5$, with transconductance $g_m$; FIG. 9d shows the current $I_{S4}$ through switch $S_4$; and FIG. 9e shows the detection current $I_0$. Detection stage 30 here serves as a ramp analog-to-digital converter providing an output voltage $V_{OUT}$ dependent on the slope of $I_0$ during the detection period. This is dependent on whether the read bit is a "0" or a "1", whereby $V_{OUT}$ indicates the detected bit-values for the read operation.

While the acquisition mode is selected at the beginning of each data line in the above example, in general this operation could be performed as frequently as desired. In practice, drifts in the electrical parameters of the system mean that relatively frequent acquisition is desirable, though too high an acquisition frequency would introduce an undesirable overhead. This issue is addressed by a fourth embodiment of the invention, employing a two-stage offset compensation technique, as illustrated schematically in FIG. 10. Again, the offset compensation apparatus 35 of this embodiment is shown for a single-probe read channel, though the system can be readily extended to a probe array as before. Apparatus 35 comprises a first offset compensation stage based generally on the system of FIG. 5 above. Specifically, the first stage includes an offset signal generator 36 implemented by an analog filter which receives the same drive signal, dc or pulse, which is applied to probe sensor S for a read operation. The impulse response of this analog filter has been selected based on a predetermined measurement of the read signal from probe sensor S. (In general this measurement may be of the read signal from that sensor alone, or may additionally include the read signals from other sensors in an array or array-subset from which an average read signal is derived as described above). In the figure, a simple example consisting of two resistors and a capacitor is shown for the analog filter of offset signal generator 36. The output of offset signal generator 36 is connected to a subtraction stage in the form of differential amplifier 37 which receives the sensor read signal on its other input. The output of differential amplifier 37 is connected to an amplifier 38, with gain $G_1$, followed by a low-pass filter 39 formed by a buffer, capacitor, resistor and switch as illustrated. Filter 39 is followed by a secondary offset compensation stage comprising two sample-and-hold circuits 40 and 41 connected to a differential amplifier 42 as illustrated. This is followed by a detection stage comprising an amplifier 43 with gain $G_2$, an analog-to-digital converter (A/D) 44 and a threshold detector 45.

During read-scanning of bit-positions in operation, the offset compensation signal generated by offset signal generator 36 is subtracted from the read signal from sensor S by differential amplifier 37. The output of differential amplifier 37 thus forms a preliminary output signal comprising the useful information signal plus any residual offset. This is amplified by first-stage amplifier 38, and then low-pass filtered by filter 39 with an integration time $T_{INT}$ (which is shorter than the pulse duration where a pulse read drive signal is used). At the end of the integration interval the preliminary output signal is sampled by the first sample-and-hold circuit 40. The sampling rate here is equal to the symbol rate 1/T where T is the read interval. Every $N^{th}$ sample is also stored by the second sample-and-hold circuit 41 which provides a reference signal which is then subtracted from the output sample from circuit 40 by differential amplifier 42. The value of N in this example corresponds to the number of bit-positions in a line of the data storage field, so that the reference signal is refreshed for each line during a read operation. The output of differential amplifier 42 constitutes a secondary output signal in which residual offsets due to variations in electrical parameters of the system are suppressed. The secondary output signal is amplified by second-stage amplifier 43 and converted by analog-to-digital converter 44. This yields a digital sample from which the value of the data bit read from the current bit position is determined by threshold detector 45.

With this two-stage adaptive offset compensation approach it is possible to cover a wide range of variations of electrical parameters of the system, and also provide a high amplification of the useful signal (the product $G_1G_2$ is typically of the order of a few hundred) without resorting to an analog-to-digital converter with a large number of bits. Of course, the higher the gain $G_1$ the more important good matching of the offset compensation signal and sensor read signal becomes. Note also that, while a typical value of N will be at least approximately equal to the number of bit-positions in a data line, other values of N may be used. Most generally, $N \geq 2$ though of course reducing the value of N increases operational complexity, and very high values of N are less efficient at following drift in the device.

Figure 11:
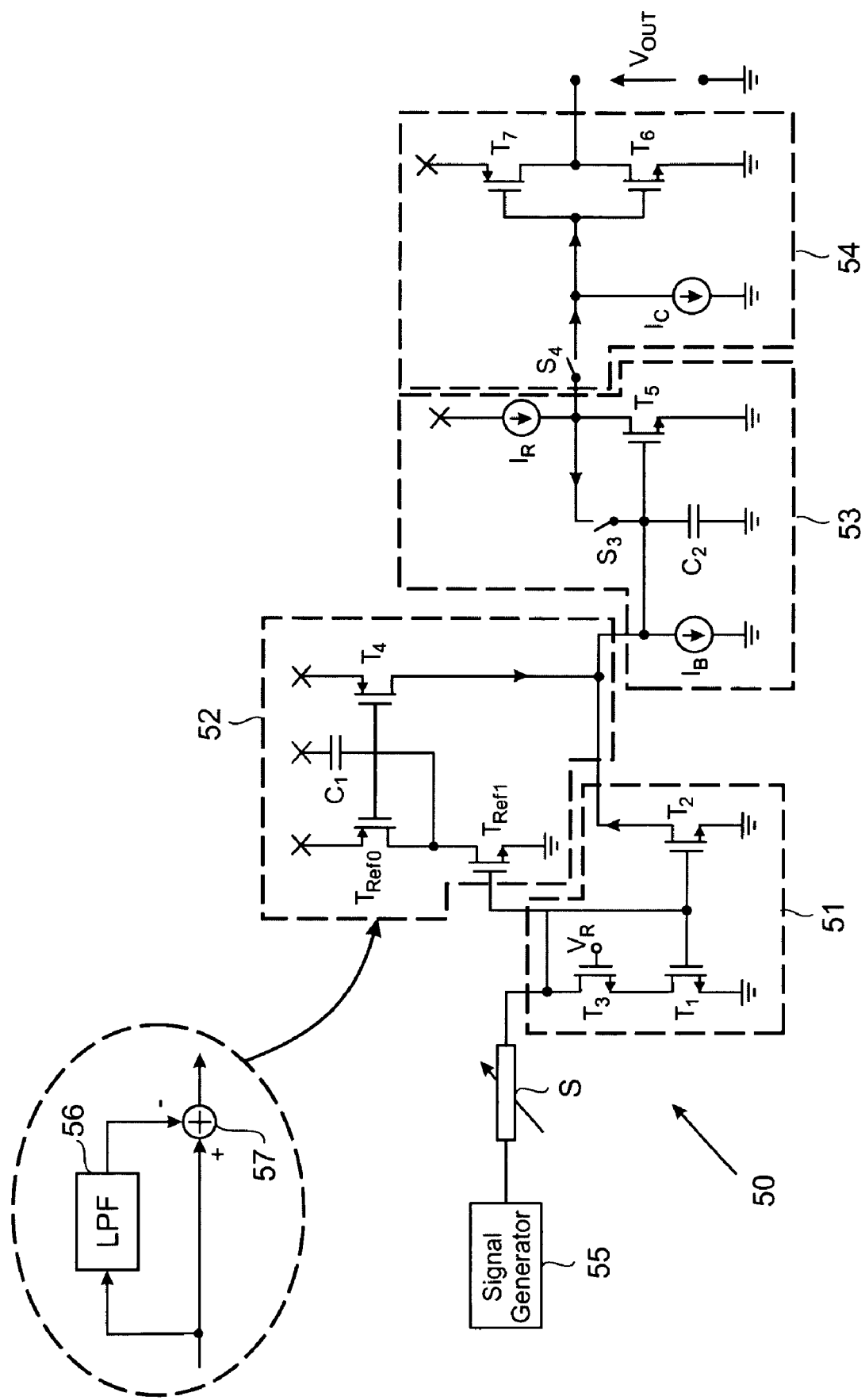
FIG. 11 shows a fifth embodiment of offset compensation apparatus according to the invention.

In offset compensation methods like that of FIG. 8 based on periodic updating of a reference parameter, there can be difficulty in following the variations of a time-varying offset. This can manifest itself as large jumps in the value of the reference parameter which also affect the read signal. This problem is solved by a fifth embodiment of the invention as illustrated in FIG. 11. The offset compensation apparatus 50 of this embodiment is broadly similar to that of FIG. 8, comprising a current mirror 51, offset signal generator and subtraction circuit 52, integration stage 53 and detection stage 54 for processing the read signal from sensor S driven by signal generator 55. However, circuit 52 here comprises transistors $T_{Ref0}$ and $T_{Ref1}$, connected as shown with transistor $T_4$ and gate capacitor $C_1$. The effect of this difference is that, rather than setting the voltage across $C_1$, and hence current through $T_4$, periodically in an acquisition phase, these values are continually updated during the read operation. Specifically, the circuit 52 is effectively equivalent to the inset circuit in the figure. The offset signal generator here takes the form of a low-pass filter 56 whose time constant is $\tau = C_1/g_m$ where $g_m$ is the transconductance of transistor $T_{Ref0}$. Low-pass filter 56 receives the sensor read signal during read-scanning, and low-pass filters the read signal over a plurality of read intervals T. The filter output is supplied to subtraction stage represented by adder 57 where it is subtracted from the sensor read signal. The output of filter 56 is thus an offset compensation signal which is continually updated in operation as a running average of the sensor read signal over a plurality of read intervals. Compared to the scheme of FIG. 8, therefore, the reference samples are effectively updated at a higher rate and then low-pass filtered to generate the offset compensation signal. The resulting offset compensation signal is thus able to track a time-varying offset.

The number of read intervals here, as determined by the filter time constant, may be set as desired for a given device, but will typically be of the order of several T. Note also that, while the system is implemented here in the analog domain, this approach may equally be implemented in the digital domain in other embodiments.

Figure 10:
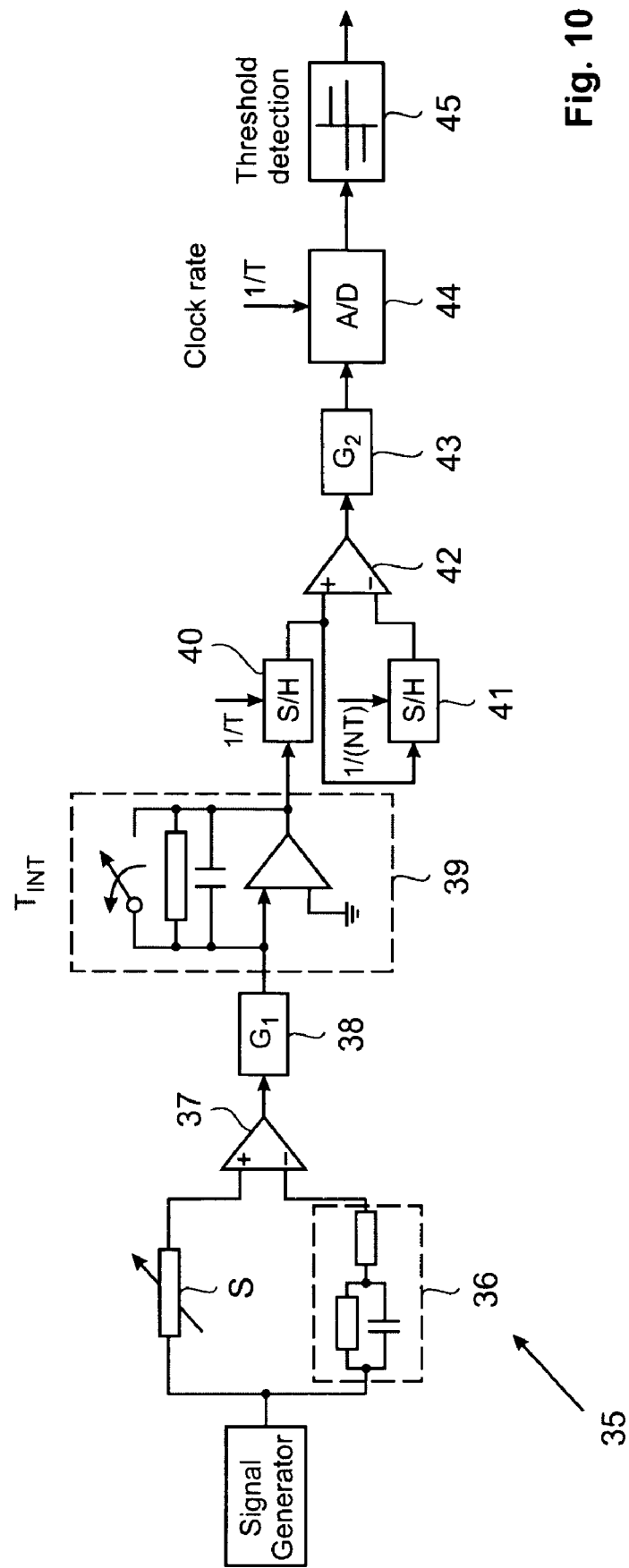
FIG. 10 shows a fourth embodiment of offset compensation apparatus according to the invention.
Figure 12:
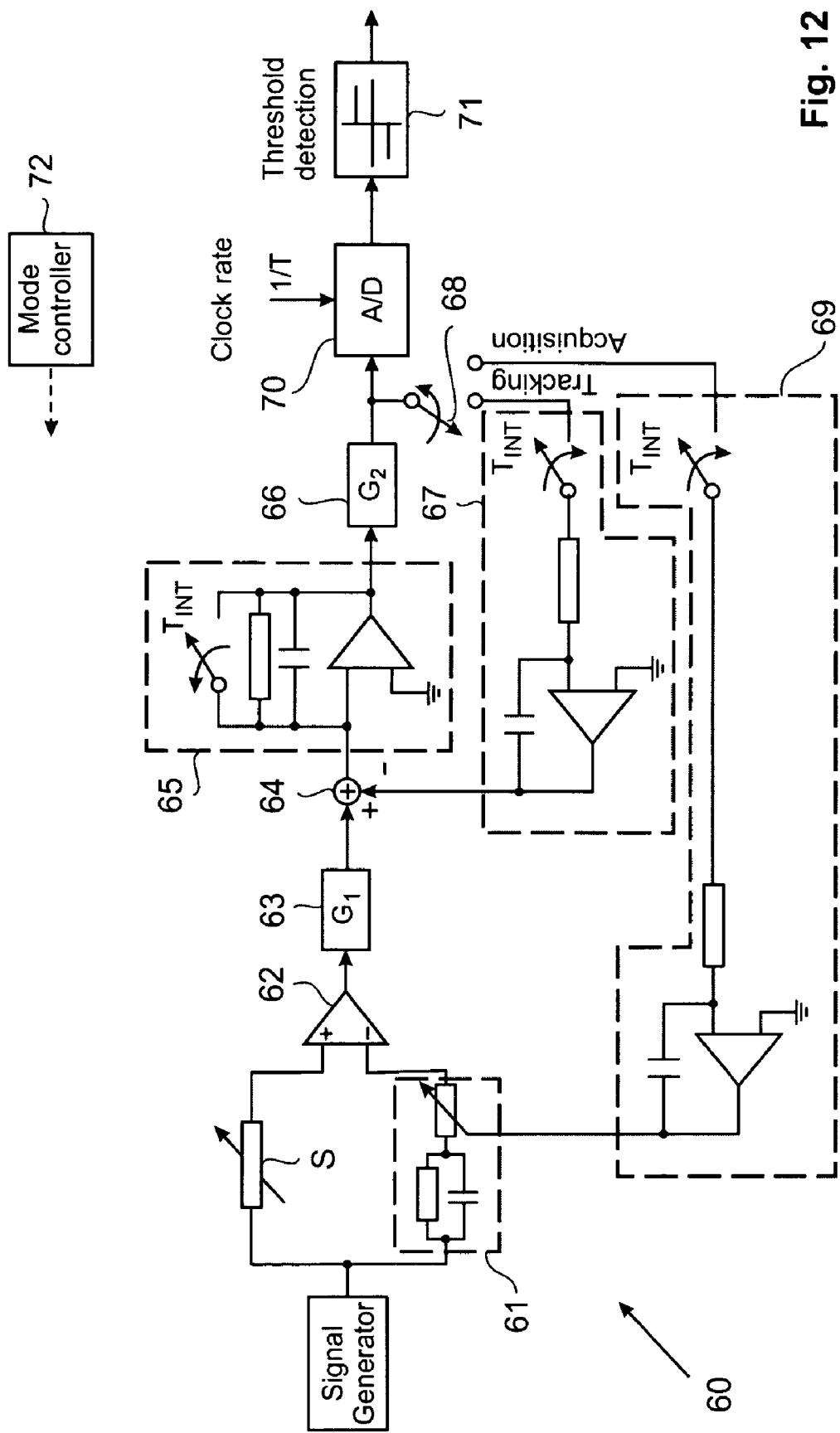
FIG. 12 shows a sixth embodiment of offset compensation apparatus according to the invention.

The constraints on matching of the read signal and the offset compensation signal in FIG. 10, and on stability of the sample-and-hold, can be relaxed by employing a fully-adaptive, simple two-stage offset compensation system as illustrated schematically in FIG. 12. The offset compensation apparatus 60 of this embodiment comprises a first offset compensation stage similar to that of FIG. 10 in that the offset signal generator 61 comprises an analog filter for filtering the drive signal to produce an offset compensation signal which is subtracted from the sensor read signal by a differential amplifier 62. In this embodiment however, the analog filter forming offset signal generator 61 is an adaptive filter, as indicated by the variable resistor employed in the simple example shown here. The output of differential amplifier 62 is connected via amplifier 63, with gain $G_1$, to a secondary offset compensation stage. This comprises an adder 64, a low-pass filter 65, a second amplifier 66 with gain $G_2$, and an integrator 67 comprising a buffer, a capacitor, a resistor and a switch as illustrated. The integrator 67 is selectively connectable to the output of amplifier 66 via a switch 68 to supply a feedback signal to a subtracting input of adder 64 as discussed below. Switch 68 can alternatively connect the output of amplifier 66 to an integrator 69 in a second feedback loop to offset signal generator 61. The output of amplifier 66 constitutes a secondary output signal which is supplied to a detection stage comprising an analog-to-digital converter (A/D) 70 and a threshold detector 71.

The apparatus 60 of this embodiment is selectively operable in an acquisition mode and a tracking mode. Selection of the operating mode is controlled by a mode controller 72 which controls operation of switch 68 and signals the acquisition mode to offset signal generator 61. As before, the acquisition mode may be selected periodically prior to read-scanning of each line of bit-positions in the probe storage field. In the acquisition mode, switch 68 connects the output of amplifier 66 to the feedback loop to offset signal generator 61. In this mode, the preliminary output signal from differential amplifier 62 is supplied, via amplifier 63, low-pass filter 65 and amplifier 66 to integrator 69. Here, the signal is integrated over an integration time $T_{INT}$ which is less than the read interval T, and the resulting acquisition feedback signal is output to offset signal generator 61. Based on the acquisition feedback signal, the offset signal generator adjusts the impulse response of the analog filter (here by adjusting the variable resistance shown in the figure) until the output of differential amplifier 62 is zero. In this way, offset signal generator effectively measures the sensor read signal by adjusting the filter response until the filter output matches the read signal from sensor S. This filter output signal constitutes the offset compensation signal which is applied by the offset signal generator during read-scanning of bit-positions in the subsequent tracking mode.

In the tracking mode, the preliminary output signal from differential amplifier 62, comprising the useful information signal plus any residual offset, is amplified by first-stage amplifier 63 and supplied to the secondary offset compensation stage. In this mode, switch 68 connects the secondary output signal from amplifier 66 to the feedback loop via integrator 67. This integrates the secondary output signal during read-scanning of a bit position over an integration time $T_{INT}$ corresponding to that of low-pass filter 65. The integration process results in a tracking feedback signal which is subtracted from the preliminary output signal by adder 64 to cancel the residual offset due to slow-varying probe characteristics. The output of adder 64 is then low-pass filtered by filter 65 with an integration time $T_{INT}$ which is shorter than the pulse duration for pulse drive signals, and amplified by amplifier 66. The secondary output signal is then converted by analog-to-digital converter 70 to yield a digital sample from which the value of the data bit read from each bit-position is determined by threshold detector 71. In this example acquisition is performed prior to read-scanning of each data line. The integrator 67 is typically active in the tracking mode during the entire read-scan of a data line. The tracking loop parameters are chosen so that the resulting high-pass filtering operation does not introduce significant distortion of the signal input to the A/D converter for data detection.

Note that the separate acquisition and tracking processes of the foregoing system prevent adaptation noise being input to the first offset compensation stage during read-scanning. Also, the tracking feedback signal is generated so that the average value of the signal at the output of amplifier 66 vanishes. However, for optimal use of the dynamic range at the input of analog-to-digital converter 70, it may be desirable that the average value of this signal at the sampling instants is zero. This can be achieved by the adaptive, two-stage digital offset cancellation system illustrated in FIG. 13. The offset compensation apparatus 75 of this embodiment is generally similar to that of FIG. 12, so that like parts are labeled by like references and only the key differences need be described. The mode control switch 68 in this embodiment is connected to the output of analog-to-digital converter 70, and the analog feedback signals for acquisition and tracking are generated in the digital domain using the A/D output samples, then converted to the analog domain by digital-to-analog converters. Specifically, the acquisition feedback loop includes a digital summation block 76 and a digital-to-analog converter (D/A) 77 which supplies the acquisition feedback signal to offset signal generator 61. Similarly, a digital summation block 78 and a digital-to-analog converter 79 are provided in the tracking feedback loop. A simple example of a one-bit digital-to-analog converter with quantization-error feedback is shown in the figure, comprising an adder, a sample delay T, a block that implements the sign function, and a one-bit converter, followed by an analog integrator as illustrated.

Figure 13:
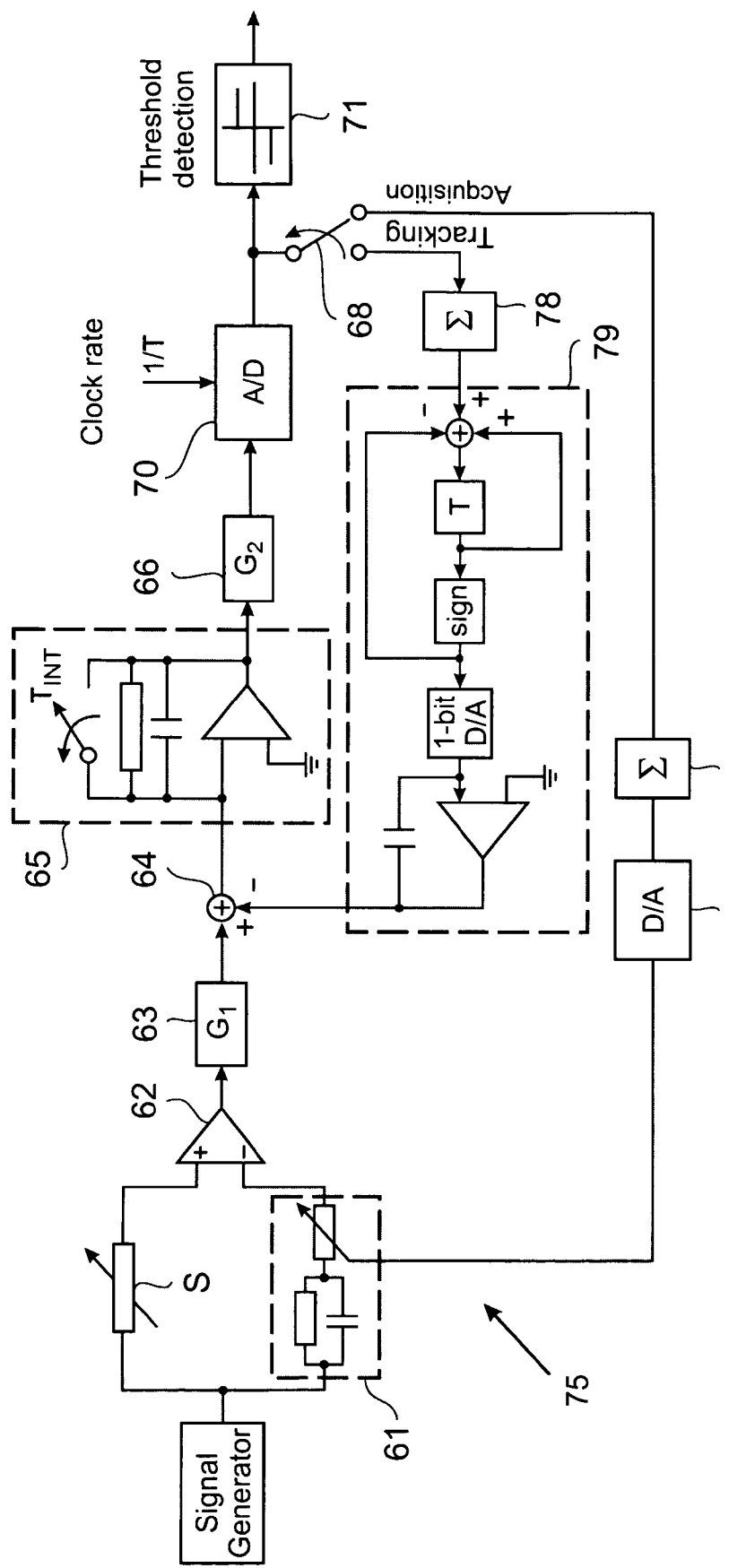
FIG. 13 shows a seventh embodiment of offset compensation apparatus according to the invention.
Figure 14:
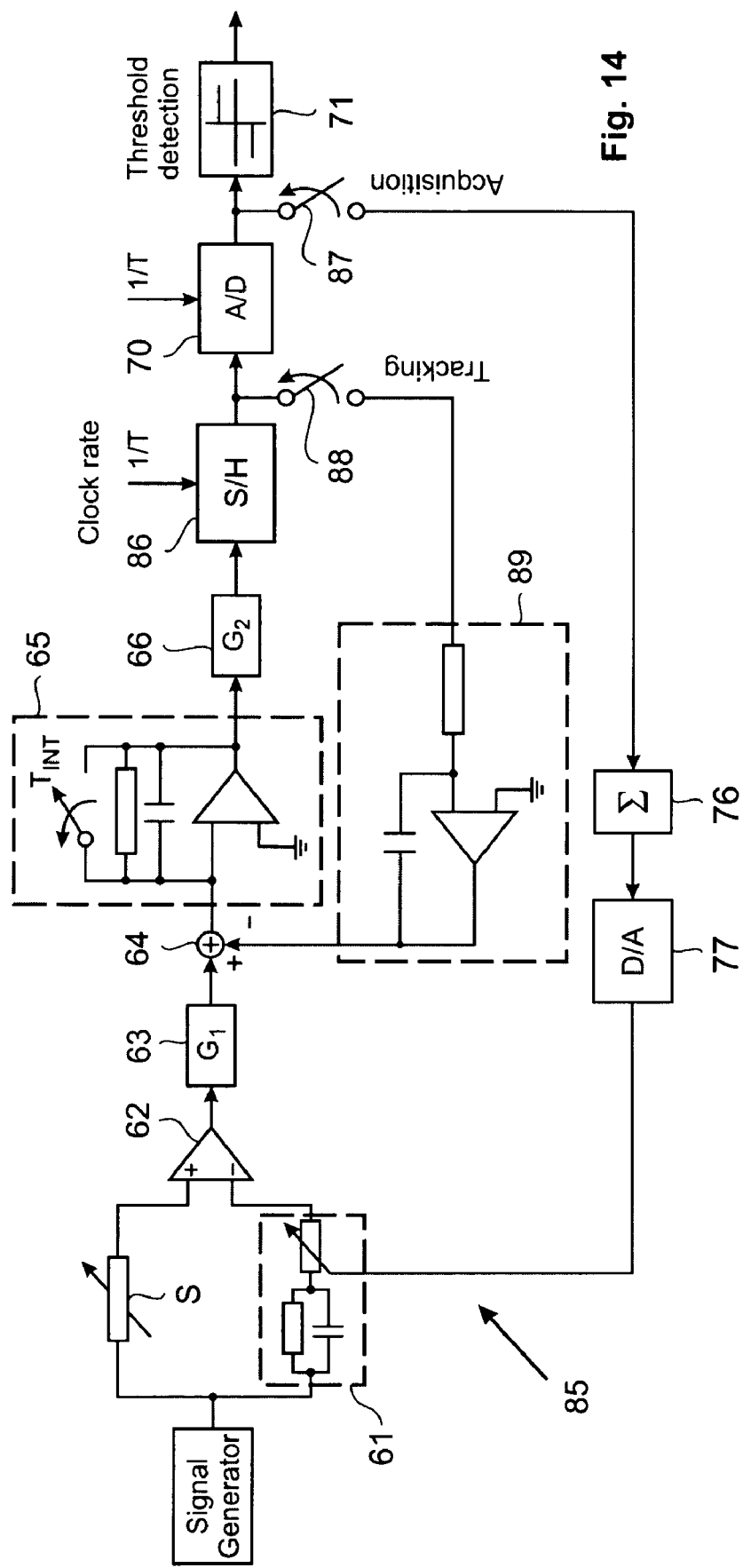
FIG. 14 shows an eighth embodiment of offset compensation apparatus according to the invention.

An alternative embodiment for adaptive, two-stage offset cancellation, where the acquisition and tracking feedback signals are generated in the analog and digital domains respectively, is illustrated in FIG. 14. Again, the offset compensation apparatus 85 of this embodiment is similar to that of FIGS. 12 and 13, like parts being labeled by like references. Here, however, a sample-and-hold circuit 86 is connected between the second-stage amplifier 66 and A/D converter 70 for sampling the secondary output signal at each bit-position. Separate mode control switches 87 and 88 are also provided for the acquisition and tracking modes respectively. Acquisition mode switch 87 is connected to the output of A/D converter 70 as in FIG. 13. Tracking mode switch 88 is connected to the output of sampler 86 and, via integrator 89, provides a tracking feedback signal to adder 64 in the tracking mode. The use of sampler 86 prior to analog-to-digital conversion in this embodiment allows generation of the tracking feedback signal in the analog domain without biassing the average of the signal at the input of A/D converter 70 at the sampling instants.

While the embodiments of FIGS. 12 to 14 have been described for a single-probe read channel, it will be apparent that these systems can be readily extended for application in a probe array. In addition, while the use of filters for implementing the offset signal generators in the foregoing embodiments is particularly desirable where pulse read drive signals are employed, simpler implementations of the offset signal generator are possible with dc drive signals since shaping of the offset compensation signal is less important. Thus, various alternative embodiments can be envisaged. By way of example, an analog front-end design, with fully-adaptive offset compensation, for a data storage device as described above with a 4×4 array of cantilever probes is illustrated schematically in FIG. 15. The read-channel for each probe P of the array is shown in the figure. This includes offset compensation apparatus indicated generally at 90, comprising two offset compensation stages, operable in an acquisition mode and a tracking mode. The first offset compensation stage of each channel includes a common offset signal generator, represented here by integrator 91, which supplies an offset compensation signal in the tracking mode to one input of a differential amplifier in that channel. The other input of the differential amplifier receives the sensor read signal from the probe to which a dc read drive signal is supplied as described above by a signal generator 92. The secondary offset compensation stage of each channel is similar to that of FIG. 14, comprising an adder, a low-pass filter, a sampler (S/H) and a tracking feedback loop with an integrator connected between the output of the sampler and the subtracting input of the adder. The sampler outputs for each column of probes are connected to a parallel-to-serial converter (P/S) 93. Each P/S converter 93 is connected to a further P/S converter 94 which outputs read-samples for the array at the rate of 16/T, where the read interval T here corresponds to the time between reading of successive bit-values from bit-positions in each storage field. The output of P/S converter 94 is connected to A/D converter 95 which outputs digital read-samples to subsequent detection circuitry for detecting the bit-values read by the array. The common acquisition feedback loop here is also connected to the output of P/S converter 94.

Figure 15:
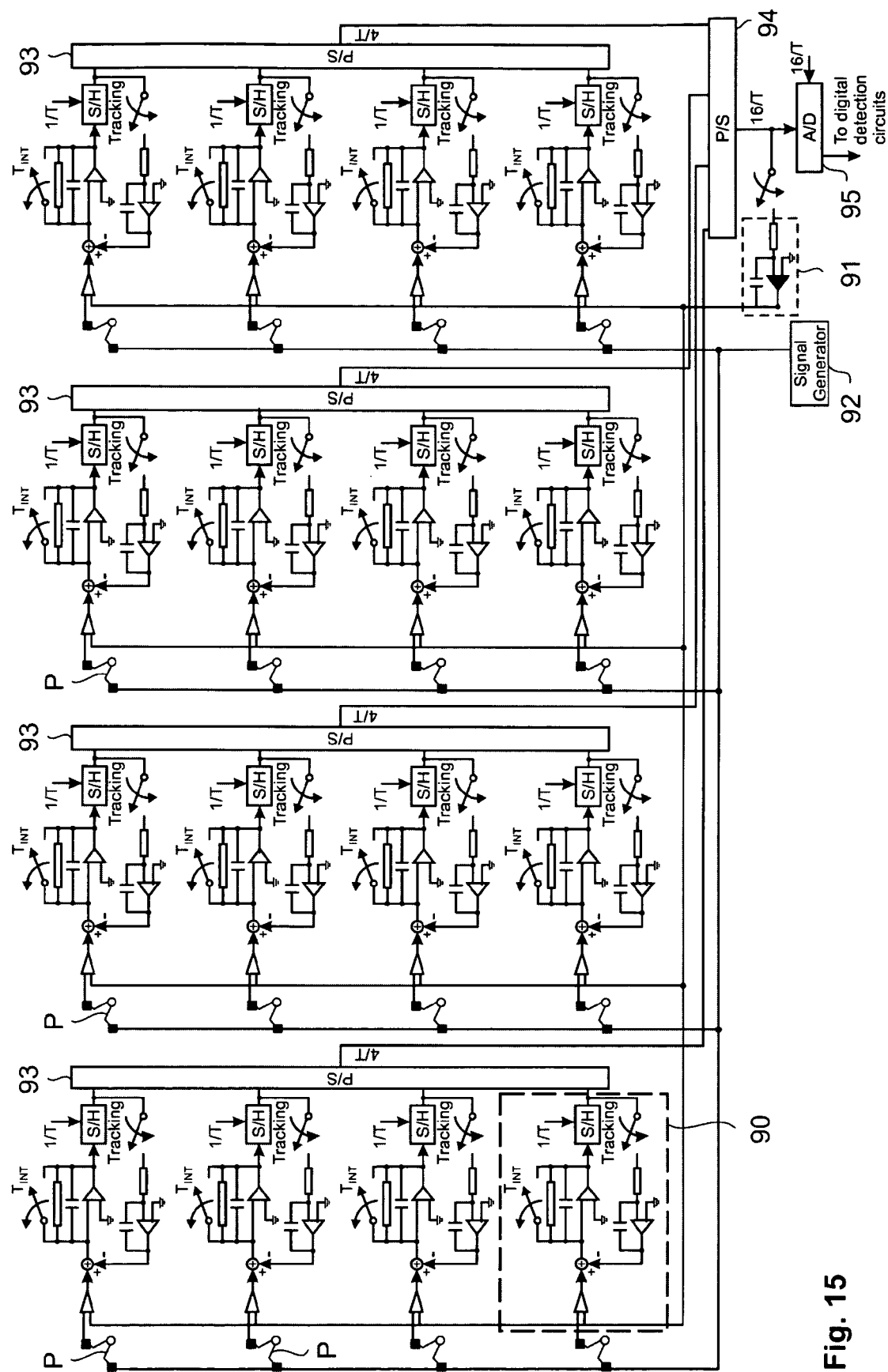
FIG. 15 shows a ninth embodiment of offset compensation apparatus according to the invention.

The operation of the FIG. 15 system for each read-channel is broadly similar to that of FIGS. 12 to 14 in that the level of the offset compensation signal is set periodically in the acquisition mode and then applied to the first offset compensation stage of each channel in the tracking mode. However, with dc reading the feedback signal generated during acquisition can be subtracted directly from the read signal without the need for a filter to produce the offset compensation signal. Also, while tests on current probe-array chips indicate that wide variations of electrical parameters from nominal values, of the order of ±20%, may be expected for probes in different arrays, parameters for probes in a given array exhibit considerably smaller deviations from the average values, of the order of 1%. In the present embodiment, therefore, the common offset signal generator 92 generates the offset compensation signal globally for the array by averaging the samples from all read-channels in the acquisition mode. The resulting integrator output signal is then supplied to all read-channels for the duration of the subsequent tracking mode. In this mode, the individual secondary offset compensation stages provide tracking feedback on a per-channel basis, thus canceling residual offset and variations of electrical parameters for the respective probes.

It will be apparent to those skilled in the art that many changes and modifications can be made to the specific embodiments described above without departing from the scope of the invention. By way of example, where particular embodiments have been described as employing dc or pulse reading, analog or digital implementations, or current- or voltage-driven read sensors, embodiments for the alternative option in each case can generally be envisaged. Also, while a probe storage device has been described above where read sensors are provided by a resistive heater formed in a cantilever-probe body, various other types of probe-sensor mechanisms may be employed in local-probe storage devices embodying the invention.

We claim:

1. An apparatus for compensating offsets, comprising means for compensating offsets in a read signal generated by a sensor associated with a probe of a local-probe data storage device during read-scanning by the probe of bit-positions on a storage surface, the means for compensating offsets comprising:
    an offset signal generator for generating an offset compensation signal dependent upon a predetermined measurement of the sensor read signal; and
    a subtraction stage for producing a preliminary output signal dependent upon the difference between the offset compensation signal and the sensor read signal at each bit-position.

2. An apparatus according to claim 1, for use in a storage device comprising an array of probes, with associated sensors, for read-scanning respective storage fields on the storage surface, wherein the offset signal generator is adapted for generating an offset compensation signal corresponding to an average sensor read signal dependent upon a predetermined measurement of sensor read signals from a plurality of the sensors in the array.

3. An apparatus according to claim 2, wherein said plurality of sensors comprises a subset of the sensors in the array.

4. An apparatus according to claim 2, wherein said plurality of sensors comprises all sensors in the array.

5. An apparatus according to claim 1, wherein the sensor read signal is generated in response to application of a drive signal to the sensor, and wherein the offset signal generator comprises an analog filter, having an impulse response dependent on said predetermined measurement, arranged for filtering the drive signal to generate the offset compensation signal.

6. An apparatus according to claim 1, wherein the offset signal generator comprises:
a digital signal generator for generating a digital signal having a plurality of non-zero samples $u_n$;
a digital-to-analog converter arranged for converting said digital signal to an analog signal; and
a low-pass filter arranged for filtering said analog signal to produce the offset compensation signal;
wherein the impulse response of the low-pass filter and the values of said samples $u_n$ are dependent on said predetermined measurement.

7. An apparatus according to claim 1, wherein:
the apparatus is selectively operable in an acquisition mode and a tracking mode; and
the offset signal generator is adapted for acquiring said predetermined measurement in the acquisition mode and for generating an offset compensation signal dependent on that measurement in the subsequent tracking mode.

8. An apparatus according to claim 7, further comprising a mode controller for selecting the acquisition mode periodically in operation.

9. An apparatus according to claim 8, wherein the mode controller is adapted for selecting the acquisition mode prior to commencement of read-scanning of successive lines of bit-positions on the storage surface.

10. An apparatus according to claim 7, for use in a device in which a dc drive signal is applied to the sensor to generate the sensor read signal at each bit-position, wherein the offset signal generator comprises a switched current memory stage which is operable in the acquisition mode to set the value of a reference current to match the current through the sensor, and in the tracking mode to supply said reference current as the offset compensation signal.

11. An apparatus according to claim 7, wherein the sensor read signal is generated in response to application of a drive signal to the sensor, the drive signal being applied to the sensor in the acquisition mode and the tracking mode, and wherein the offset signal generator comprises an adaptive analog filter for filtering the drive signal in the acquisition and tracking modes, the offset signal generator being adapted for adjusting the impulse response of the filter dependent upon an acquisition feedback signal in the acquisition mode such that the filter output signal matches the sensor read signal in the acquisition mode.

12. An apparatus according to claim 1, further comprising a detection stage for processing said preliminary output signal to detect the data read from said bit-positions.

13. An apparatus according to claim 1, further comprising a secondary offset compensation stage adapted for:
sampling said preliminary output signal at each bit-position;
storing every $N^{th}$ output signal sample as a reference signal, where $N \geq 2$; and
subtracting the reference signal from the output signal sample at each bit-position to produce a secondary output signal.

14. An apparatus according to claim 13, wherein N is at least approximately equal to the number of bit-positions in a line of bit-positions on the storage surface.

15. An apparatus according to claim 13, further comprising a detection stage for processing the secondary output signal to detect the data read from said bit-positions.

16. An apparatus according to claim 1, further comprising a secondary offset compensation stage adapted for:
subtracting a tracking feedback signal from said preliminary output signal at each bit-position to produce a secondary output signal; and
generating the tracking feedback signal by integration of the secondary output signal.

17. An apparatus according to claim 11, further comprising a secondary offset compensation stage adapted for:
subtracting a tracking feedback signal from said preliminary output signal at each bit-position to produce a secondary output signal; and
generating the tracking feedback signal by integration of the secondary output signal.

18. An apparatus according to claim 16, further comprising an analog-to-digital converter for analog-to-digital conversion of the secondary output signal, wherein the secondary offset compensation stage is adapted for generating the tracking feedback signal from the output of the analog-to-digital converter.

19. An apparatus according to claim 11, wherein the apparatus is adapted for generating the acquisition feedback signal from the output of the analog-to-digital converter in the acquisition mode.

20. An apparatus according to claim 16, further comprising a sampler for sampling the secondary output signal at each bit-position, wherein the secondary offset compensation stage is adapted for generating the tracking feedback signal from the secondary output signal samples.

21. An apparatus according to claim 11, further comprising an analog-to-digital converter connected to the output of the sampler, the apparatus being adapted for generating the acquisition feedback signal from the output of the analog-to-digital converter in the acquisition mode.

22. An apparatus according to claim 16, further comprising a detection stage for processing the secondary output signal to detect the data read from said bit-positions.

23. An apparatus for compensating offsets in a read signal generated by a sensor associated with a probe of a local-probe data storage device during read-scanning by the probe of bit-positions on a storage surface, the apparatus comprising:
an offset signal generator for receiving the sensor read signal during read scanning and low-pass filtering the read signal over a plurality of read intervals, where a read interval corresponds to the time between reading of successive bits from the storage surface, to generate an offset compensation signal; and
a subtraction stage for producing an output signal dependent on the difference between the offset compensation signal and the sensor read signal at each bit-position.

24. An apparatus according to claim 23, further comprising a detection stage for processing the output signal to detect the data read from said bit-positions.

25. A local-probe data storage device comprising:
a storage surface for storing data represented by the presence and absence of pits at bit-positions on the surface;
at least one probe for read-scanning of bit-positions on the storage surface, the probe having an associated sensor for generating a read signal indicative of data read from said bit-positions during read-scanning; and
offset compensation apparatus for compensating offsets in the read signal generated by the sensor associated with the or each probe, the apparatus comprising an offset signal generator for generating an offset compensation signal dependent upon a predetermined measurement of the sensor read signal, and a subtraction stage for producing a preliminary output signal dependent on the difference between the offset compensation signal and the sensor read signal at each bit-position.

26. A device according to claim 25, further comprising an array of probes, with associated sensors, for read-scanning respective storage fields of the array.

27. A local-probe data storage device comprising:
a storage surface for storing data represented by the presence and absence of pits at bit-positions on the surface;
at least one probe for read-scanning of bit-positions on the storage surface, the probe having an associated sensor for generating a read signal indicative of data read from said bit-positions during read-scanning; and
offset compensation apparatus for compensating offsets in the read signal generated by the sensor associated with the or each probe, the apparatus comprising an offset signal generator for receiving the sensor read signal during read scanning and low-pass filtering the read signal over a plurality of read intervals, where a read interval corresponds to the time between reading of successive bits from the storage surface, to generate an offset compensation signal, and a subtraction stage for producing an output signal dependent on the difference between the offset compensation signal and the sensor read signal at each bit-position.

28. A device according to claim 27, further comprising an array of probes, with associated sensors, for read-scanning respective storage fields of the array.

29. A method for compensating offsets in a read signal generated by a sensor associated with a probe of a local-probe data storage device during read-scanning by the probe of bit-positions on a storage surface, the method comprising:
generating an offset compensation signal dependent upon a predetermined measurement of the sensor read signal; and
producing a preliminary output signal dependent on the difference between the offset compensation signal and the sensor read signal at each bit-position.

30. A method comprising compensating offsets in a read signal generated by a sensor associated with a probe of a local-probe data storage device during read-scanning by the probe of bit-positions on a storage surface, the step of compensating offsets comprising:
supplying the sensor read signal to an offset signal generator during read scanning;
at the offset signal generator, low-pass filtering the read signal over a plurality of read intervals, where a read interval corresponds to the time between reading of successive bits from the storage surface, to generate an offset compensation signal; and
producing an output signal dependent on the difference between the offset compensation signal and the sensor read signal at each bit-position.

* * * * *